(12) United States Patent
He et al.

(10) Patent No.: US 10,916,591 B2
(45) Date of Patent: Feb. 9, 2021

(54) PIXEL STRUCTURE, DISPLAY PANEL, DISPLAY APPARATUS, AND MASK PLATE

(71) Applicants: Chengdu BOE Optoelectronics Technology Co., Ltd., Chengdu (CN); BOE TECHNOLOGY GROUP CO., LTD., Beijing (CN)

(72) Inventors: Panting He, Beijing (CN); Chang Luo, Beijing (CN); Ju Mei, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/623,986

(22) PCT Filed: Apr. 19, 2019

(86) PCT No.: PCT/CN2019/083501
§ 371 (c)(1),
(2) Date: Dec. 18, 2019

(87) PCT Pub. No.: WO2019/201339
PCT Pub. Date: Oct. 24, 2019

(65) Prior Publication Data
US 2020/0144339 A1 May 7, 2020

(30) Foreign Application Priority Data
Apr. 20, 2018 (CN) .......................... 2018 1 0365406

(51) Int. Cl.
*H01L 27/32* (2006.01)
(52) U.S. Cl.
CPC ............................. *H01L 27/3218* (2013.01)

(58) Field of Classification Search
CPC . H01L 27/3211; H01L 27/3218; G09G 3/364; G09G 3/3644; G09G 3/2074;
(Continued)

(56) References Cited

U.S. PATENT DOCUMENTS 6,326,981 B1 * 12/2001 Mori ................. G02F 1/133514
345/694
10,013,913 B2 7/2018 Guo et al.
(Continued)

FOREIGN PATENT DOCUMENTS

CN 104201192 12/2014
CN 104330913 A 2/2015
(Continued)

OTHER PUBLICATIONS

International Search Report and Written Opinion dated Jul. 25, 2019 for PCT Patent Application No. PCT/CN2019/083501.
(Continued)

*Primary Examiner* — Jose R Diaz
(74) *Attorney, Agent, or Firm* — Thomas|Horstemeyer, LLP (57) ABSTRACT

A pixel structure, the pixel structure comprising a plurality of pixels arranged in an array, each pixel comprising three sub-pixels of different colours arranged in two adjacent rows; the plurality of pixels also comprise a plurality of first pixels and a plurality of second pixels, the plurality of first pixels and the plurality of second pixels being arranged alternately along the row direction; along the row direction, one sub-pixel of each first pixel is positioned in the same row as two sub-pixels of the adjacent second pixel, and the other two sub-pixels of each first pixel are positioned in the same row as the other sub-pixel in the adjacent second sub-pixel; and two sub-pixels positioned in different rows in
(Continued)

each first pixel are respectively adjacent to the sub-pixels of the same corresponding colour in an adjacent second pixel.

17 Claims, 6 Drawing Sheets

(58) Field of Classification Search
CPC ............... G09G 3/3607; G09G 3/2003; G09G 2300/0452; G09G 2300/0439; G02F 2001/134345
See application file for complete search history.

(56) References Cited

U.S. PATENT DOCUMENTS

| | | | |
|---|---|---|---|
| 2009/0179842 A1 | 7/2009 | Chen et al. | |
| 2015/0021637 A1* | 1/2015 | Ahn | H01L 27/3218 257/89 |
| 2017/0132969 A1 | 5/2017 | Guo et al. | |
| 2020/0058713 A1* | 2/2020 | Zhang | C23C 14/042 |

FOREIGN PATENT DOCUMENTS

| | | |
|---|---|---|
| CN | 104795427 | 7/2015 |
| CN | 105762169 | 7/2016 |
| CN | 106898634 | 6/2017 |
| CN | 106932988 | 7/2017 |
| CN | 207068854 | 3/2018 |
| CN | 108493224 | 9/2018 |
| JP | 2008298966 | 12/2008 |

OTHER PUBLICATIONS

1st Office Action dated Mar. 26, 2020 for Chinese Patent Application No. 201810365406.8.
Second Office Action for CN Patent Application No. 201810365406.8 dated Jul. 27, 2020.

\* cited by examiner

PIXEL STRUCTURE, DISPLAY PANEL, DISPLAY APPARATUS, AND MASK PLATE

The present disclosure is a § 371 national phase application of PCT Patent Application No. PCT/CN2019/083501 filed Apr. 19, 2019, which claims the benefit of and priority to Chinese Patent Application No. 201810365406.8, entitled "PIXEL ARRANGEMENT STRUCTURE, DISPLAY PANEL, DISPLAY DEVICE AND MASK PLATE", filed on Apr. 20, 2018, the entire contents of which are hereby incorporated by reference.

TECHNICAL FIELD

The present disclosure relates to display technologies and, in particular, to a pixel structure and a display panel, a display device, and a mask plate.

BACKGROUND

During the manufacturing process of a display device, some pattern film layers related to sub-pixels generally need to be formed by using a fine metal mask (FMM) through an evaporation process. For example, in the process of manufacturing an organic light emitting diode (OLED) display device, FMM is often used to manufacture a light emitting pattern layer of the OLED device. The size of each opening in the FMM is basically the same as that of the corresponding sub-pixel in the OLED display device.

SUMMARY

In a first aspect, a pixel structure is provided. The pixel structure includes a plurality of pixels arranged in an array, each pixel including three sub-pixels of different colors arranged in two adjacent rows. The plurality of pixels further include a plurality of first pixels and a plurality of second pixels, the plurality of first pixels and the plurality of second pixels being alternately arranged in sequence along a row direction. Along the row direction, one sub-pixel in each first pixel is positioned in the same row as two sub-pixels in an adjacent second pixel, and the other two sub-pixels in each first pixel are positioned in the same row as the other sub-pixel in the adjacent second sub-pixel. Two sub-pixels positioned in different rows in each first pixel are disposed adjacent to corresponding same colored sub-pixels in adjacent second pixels.

In some embodiments, among the three sub-pixels of each pixel, a central line of a gap between two sub-pixels in the same row along the row direction is aligned with a central line of another sub-pixel in an adjacent row along the row direction.

In some embodiments, the two sub-pixels in each first pixel disposed adjacent to the corresponding same colored sub-pixels in the adjacent second pixels include one red sub-pixel and one blue sub-pixel.

In some embodiments, the plurality of pixels positioned in the same column includes a plurality of first pixels or a plurality of second pixels.

In some embodiments, an opening shape of each of the sub-pixels includes a quadrangle, a pentagon, or a hexagon.

In some embodiments, an opening shape of each of the sub-pixels includes a pentagon arranged axisymmetrically, and five corners of the pentagon include a pair of right-angles arranged adjacently.

In some embodiments, among the three sub-pixels of each pixel, first right-angle sides of two sub-pixels positioned in the same row are flush with each other, and the first right-angle sides of the two sub-pixels are parallel with a first right-angle side of another sub-pixel in an adjacent row, and the three sub-pixels are positioned between a line where the first right-angle sides of the two sub-pixels are positioned and a line where the first right-angle side of the another sub-pixel is positioned; the first right-angled right-angle side is an side positioned between two adjacent right angles in the pentagon.

In a second aspect, a display panel is provided. The display panel includes the pixel structure according to the first aspect.

In a third aspect, a display device is provided. The display device includes the display panel according to the second aspect.

In a fourth aspect, a mask plate group is provided. The mask plate group is configured to manufacture the pixel structure described in the first aspect, and the mask plate group includes three mask plates provided in one-to-one correspondence with sub-pixel colors. Each of the three mask plates is respectively provided with a plurality of openings, wherein any one of the openings of at least two mask plates corresponds to two adjacent sub pixels of the same color in the pixel structure.

BRIEF DESCRIPTION OF THE DRAWINGS

In order to more clearly illustrate the technical solutions in some embodiments of the present disclosure, the drawings used in some embodiments of the present disclosure will be briefly introduced below. It is understood that the drawings in the following description show only some of the embodiments of the present disclosure, and other drawings may be obtained by those skilled in the art without departing from the drawings described herein.

DETAILED DESCRIPTION

In the following, the technical solutions in some embodiments of the present disclosure will be clearly and completely described with reference to the drawings in some embodiments of the present disclosure. Understandably, the described embodiments are only part of the embodiments of the present disclosure, but not all of the embodiments. Based on some embodiments in the present disclosure, all other embodiments obtained by those skilled in the art without creative work shall fall within the protection scope of the present disclosure.

Some embodiments of the present disclosure provide a pixel structure. Referring to FIG. 1 to FIG. 4, the pixel structure includes a plurality of pixels arranged in an array, each pixel including three sub-pixels of different colors arranged in two adjacent rows. The plurality of pixels further include a plurality of first pixels 100 and a plurality of second pixels 200, and the plurality of first pixels 100 and the plurality of second pixels 200 are alternately arranged in sequence along a row direction X. Along the row direction X, one sub-pixel in each first pixel 100 is positioned in the same row as two sub-pixels in an adjacent second pixel 200, and the other two sub-pixels in each first pixel 100 are positioned in the same row as the other sub-pixel in the adjacent second sub-pixel 200. Two sub-pixels positioned in different rows in each first pixel 100 are disposed adjacent to corresponding same colored sub-pixels in the adjacent second pixels 200, respectively.

FIGS. 1 to 4 are only schematic representations of the first pixel 100 and the second pixel 200. The positions of the two pixels may be interchanged, which is not limited in some embodiments of the present disclosure. In order to clearly describe the pixel structure in some embodiments of the present disclosure, a column where the first pixels and the second pixels are positioned is defined as a pixel column, and a row where the first pixels and the second pixels are positioned is defined as a pixel row; each pixel row includes two sub-pixel rows, and the two sub-pixel rows are defined as a first row and a second row according to their column order. The following descriptions are based on such definitions.

It should be noted here that the above pixels (including the first pixels and the second pixels) adopt a Real RGB pixel structure, that is, each pixel includes three sub-pixels of different colors which are a red sub-pixel R, a green sub-pixel G, and a blue sub-pixel B, and individual sub-pixels have the same shape and equal area. Pixels are divided into a plurality of first pixels and a plurality of second pixels according to the distribution of the three sub-pixels therein. The distribution (including color and relative position) of sub-pixels in different first pixels is the same, and the distribution (including color and relative position) of sub-pixels in different second pixels is the same.

Figure 1:
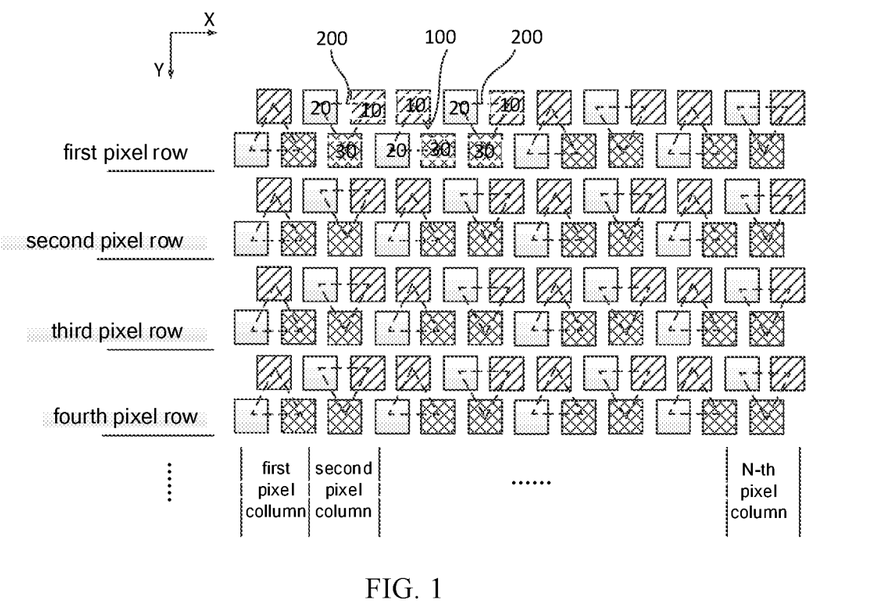
FIG. 1 is a schematic structural diagram of a pixel structure according to some embodiments of the present disclosure.

As shown in FIG. 1, three sub-pixels in each pixel are defined as: a first sub-pixel 10 (for example, a red sub-pixel R), a second sub-pixel 20 (for example, a green sub-pixel G), and a third sub-pixels 30 (for example, a blue sub-pixel B). Each first pixel 100 adopts a triangle structure, that is, the first sub-pixel 10, the second sub-pixel 20, and the third sub-pixel 30 in each first pixel 100 are respectively used as the three vertices of the triangle. Each second pixel 200 adopts an inverted triangle structure, that is, the second sub-pixel 20, the third sub-pixel 30, and the first sub-pixel 10 in each second pixel 200 are respectively used as the three vertices of the inverted triangle.

The plurality of first pixels 100 and the plurality of second pixels 200 being alternately arranged in sequence along a row direction X means that one second pixel 200 is provided between two adjacent first pixels 100, and one first pixel 100 is provided between two adjacent second pixels 200. Along the row direction X shown in FIG. 1, a first sub-pixel 10 in each first pixel 100 and a first sub-pixel 10 and a second sub-pixel 20 in adjacent second pixels 200 are positioned in the first row of this pixel row. A second sub-pixel 20 and a third sub-pixel 30 in each first pixel 100 and a third sub-pixels 30 in the adjacent second pixels 200 are positioned in the second row of this pixel row. In this way, a first sub-pixel 10 in each first pixel 100 and a first sub-pixel 10 in an adjacent second pixel 200 are disposed adjacently, and a third sub-pixel 30 in the first pixel 100 and a third sub-pixel 30 in an adjacent second pixel 200 are disposed adjacently.

It should be understood that the plurality of first pixels 100 and the plurality of second pixels 200 are alternately arranged in sequence along a row direction X. The first sub-pixel 10 in each first pixel 100 is adjacent to the first sub-pixel 10 in one of the adjacent (left or right) second pixels 200, and the third sub-pixel 30 in each first pixel 100 is adjacent to the third sub-pixel 30 in one of the adjacent (left or right) second pixels 200.

In some examples, as shown in FIG. 1, a first sub-pixel 10 in one first pixel 100 is disposed adjacent to a first sub-pixel 10 in one left adjacent second pixel 200, and a third sub-pixel 30 in the first pixel 100 is disposed adjacent to a third sub-pixel 30 of the right adjacent second pixel 200. As such, there are two sets of sub-pixels of the same color disposed adjacent to each other in every three adjacent sub-pixels, one of the two sets of sub-pixels include the first sub-pixels 10 and another one of the two sets of sub-pixels include the third sub-pixels 30.

Figure 3:
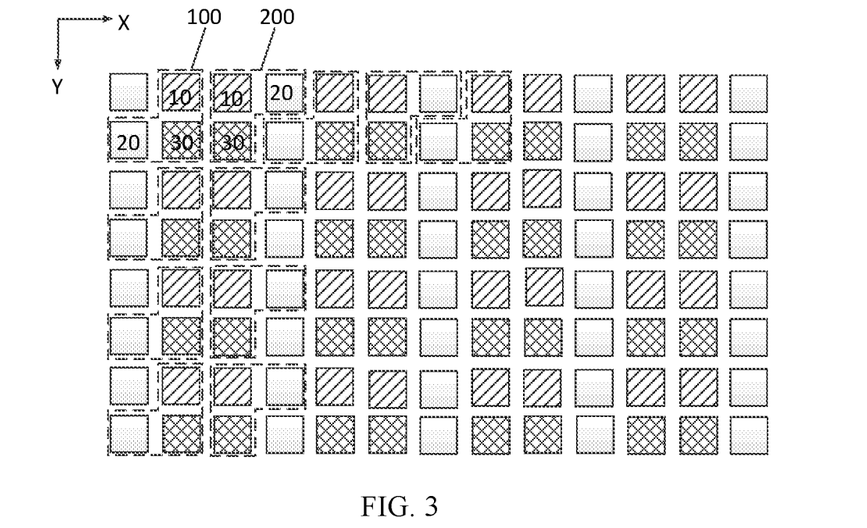
FIG. 3 is a schematic structural diagram of still another pixel structure according to some embodiments of the present disclosure.

In other examples, as shown in FIG. 3, the first sub-pixel 10 and the third sub-pixel 30 in one first pixel 100 are respectively disposed adjacent to the corresponding sub-pixels in the same adjacent second pixel 200. As such, there are two sets of sub-pixels of the same color disposed adjacent to each other in every three adjacent sub-pixels, one of the two sets of sub-pixels include the first sub-pixels 10 and the other one of the two sets of sub-pixels include the third sub-pixels 30.

In addition, the above-mentioned pixel structure is generally formed by a mask process. In the mask process, an organic material is generated by using an evaporation source, and the organic material is sprayed on an area where a sub-pixel is to be formed through an opening on the mask plate to form an organic film included in the sub-pixel. According to embodiments, the organic film includes a color light-emitting film or a color filter film.

In the process of forming the above pixel structure by using a mask for a mask process, the sub-pixels of different colors need to use different masks correspondingly. Since the first sub-pixel to be formed in the first pixel and the first sub-pixel to be formed in the adjacent second pixel have the same color, the area where the first sub-pixel in the first pixel is to be formed and the area where the first sub-pixel in the adjacent second pixel is to be formed correspond to the same opening in the mask when the mask process is performed to form each first sub-pixel by using the mask plate. Compared with the case that the area for forming each sub-pixel corresponds one opening in the mask plate, the opening in the mask plate can correspond two areas for forming two adjacent sub-pixels of the same color. The organic film in two sub-pixels can be made simultaneously using one opening in the mask plate, which increases area of each opening in the mask plate. As a result, the area of each opening in the mask plate increases, which not only reduces the difficulty in manufacturing the mask plate, but also reduces the difficulty in alignment during the mask process, so as to reduce the probability of color mixing and improve the uniformity of the sub-pixel arrangement.

A pixel is the smallest unit of image display, and the sub-pixels are generally arranged in a compact arrangement. As can be seen from the foregoing, for some embodiments of the present disclosure, sub-pixels in a pixel are distributed in two adjacent rows, that is, the first row and the second row in the same pixel row. In the arrangement, for the first pixel, the first sub-pixel of the first row is set at least within the outer boundary of the second sub-pixel and the third sub-pixel of the second row along the row direction. The outer boundary of the second sub-pixel along the row direction is a straight line where the second sub-pixel is positioned away from the opening side of the third sub-pixel, and the straight line is perpendicular to the row direction. The outer boundary of the third sub-pixel along the row direction is a straight line where the third sub-pixel is positioned away from the opening side of the second sub-pixel, and the straight line is perpendicular to the row direction. Similarly, for the second pixel, the third sub-pixel in the second row is set at least within the outer boundary of the first and second sub-pixels in the first row along the row direction.

As shown in FIG. 3, in each first pixel 100, the first sub-pixel 10 separately positioned in the first row and the third sub-pixel 30 of the two sub-pixels positioned in the second row are positioned in the same column (that is, the three sub-pixels are L-shaped); or, the first sub-pixel 10 separately positioned in the first row and the second sub-pixel 20 of the two sub-pixels in the second row are positioned in the same column (not described in the drawings herein). Alternatively, the first sub-pixel 10 separately positioned in the first row is positioned between two outer boundaries of the second sub-pixel 20 and the third sub-pixel 30 in the corresponding second row along the row direction, that is, staggered arrangement (not described in the drawings herein).

Referring to FIG. 3, in each second pixel 200, the third sub-pixel 30 separately positioned in the second row and the first sub-pixel 10 of the two sub-pixels positioned in the first row are positioned in the same column (that is, three sub-pixels are L-shaped); or, the third sub-pixel 30 separately positioned in the second row and the second sub-pixel 20 of the two sub-pixels in the first row are positioned in the same column (not described in the drawings herein); alternatively, the third sub-pixel 30 separately positioned in the second row is positioned between two outer boundaries of the first sub-pixel 10 and the second sub-pixel 20 in the corresponding first row along the row direction, that is, staggered arrangement (not described in the drawings herein).

In some embodiments, as shown in FIG. 1, among the three sub-pixels of each pixel, a central line of a gap between two sub-pixels in the same row along the row direction is aligned or approximately aligned (coincided, approximately coincided) with a central line of another sub-pixel in an adjacent row along the row direction. The gap between two sub-pixels in the same row refers to a space between the two sub-pixels, which is a small fixed space or infinitely small (for example, approximately 0, and the center line of the corresponding gap along the row direction is the line where the boundary line between the two sub-pixels is positioned). Assuming that the size of a sub-pixel along the row direction is the width of the sub-pixel, the above-mentioned center line of the sub-pixel along the row direction refers to a straight line where the width center is positioned and is perpendicular to the row direction.

Referring to FIG. 1, in each first pixel 100, the first sub-pixel 10 in the first row along the row direction is offset from the second sub-pixel 20 or the third sub-pixel 30 in the second row by a half of the width of the first sub-pixel 10 (the dimension of the first sub-pixel 10 along the row direction). In each second pixel 200, the third sub-pixel 30 in the second row along the row direction is offset from the second sub-pixel 20 or the first sub-pixel 10 in the first row by a half of the width of the third sub-pixel 30 (the dimension of the third sub-pixel 30 along the row direction). In this way, the line connecting the centers of three sub-pixels in the same pixel constitutes an isosceles triangle (refer to the dotted triangles shown in FIG. 1 and FIG. 2).

Various embodiments of the present disclosure adopt the above-mentioned sub-pixel arrangement, which can make the arrangement of three sub-pixels in each pixel more uniform and compact, and can also make the display panel adopting the pixel structure to display uniform color and exquisite pictures.

In some embodiments, the plurality of first pixels 100 (referring to the triangle in FIG. 1) and the plurality of second pixels 200 (referring to the inverted triangle in FIG. 1) are alternately arranged in sequence along a row direction X (for example, triangles and inverted triangles are alternately arranged in sequence). In some embodiments, the first pixels 100 and the second pixels 200 in the pixel structure are arranged along the column direction Y, and embodiments of the present disclosure do not impose specific limitations on this.

According to embodiments, the plurality of pixels positioned in the same column includes a plurality of first pixels or a plurality of second pixels. That is to say, as shown in FIG. 1, along the column direction Y, pixels in each pixel column are pixels of the same type, such as the first pixel 100 (triangles), or the second pixel 200 (inverted triangles).

Figure 2:
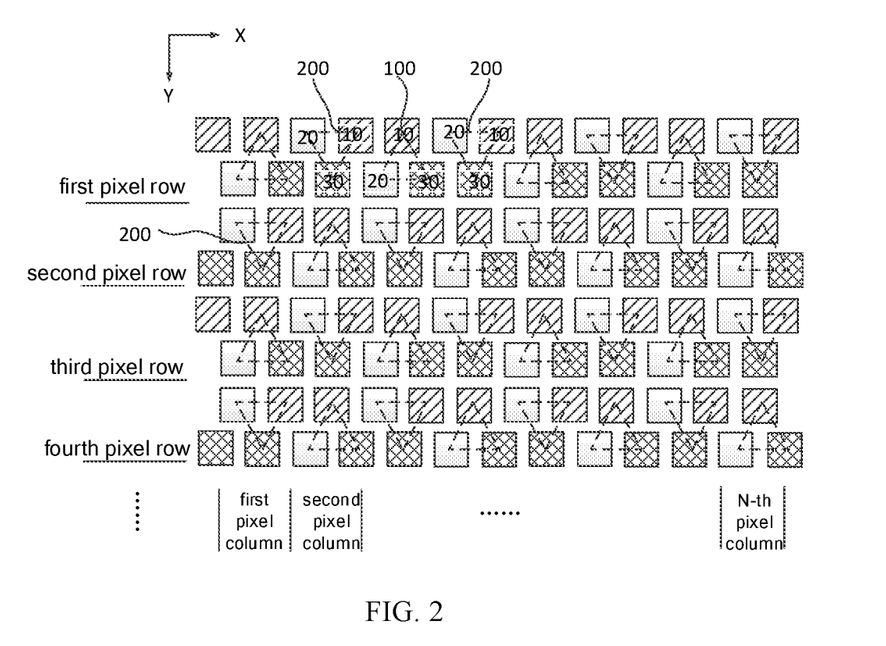
FIG. 2 is a schematic structural diagram of another pixel structure according to some embodiments of the present disclosure.

According to embodiments, as shown in FIG. 2, the plurality of first pixels 100 and the plurality of second pixels 200 are alternately arranged in sequence along the column direction Y. That is, along the column direction Y, one second pixel 200 is disposed between two adjacent first pixels 100, and one first pixel 100 is disposed between two adjacent second pixels 200.

Referring to FIG. 2 again, in a case where the plurality of first pixels 100 and the plurality of second pixels 200 are alternately arranged along the row direction X and the column direction Y in sequence, along the row direction X shown in FIG. 2, the first sub-pixel 10 in each first pixel 100 and the first sub-pixel 10 in an adjacent second pixel 200 are adjacent, and the third sub-pixel 30 in each first pixel 100 and the third sub-pixel 30 in an adjacent second pixel 200 are adjacent. Along the column direction Y shown in FIG. 2, the second sub-pixel 20 in each first pixel 100 and the second sub-pixel 20 in an adjacent second pixel 200 are adjacent. In this way, the first sub-pixel 10, the second sub-pixel 20, and the third sub-pixel 30 in each pixel can be disposed adjacent to a corresponding sub-pixel of the same color; of course, the corresponding sub-pixels adjacent to the first sub-pixel 10, the second sub-pixel 20, and the third sub-pixel 30 do not belong to the same pixel. In this way, any opening of each mask plate in the mask plate group configured to manufacture the pixel structure shown in FIG. 2 corresponds to two adjacent sub pixels of the same color in the pixel structure. The organic film in two sub-pixels can be made simultaneously using one opening in the mask plate, which increases area of each opening in the mask plate as much as possible, and not only reduces the difficulty in manufacturing the mask plate, but also reduces the difficulty in alignment during the mask process, so as to reduce the probability of color mixing and improve the uniformity of the sub-pixel arrangement.

It should be noted that, in the same viewing angle range, human eyes can more easily observe green color than the red and blue colors, that is, human eyes are most sensitive to the green color. When the red, blue, and green light emitted by the plurality of sub-pixels enter human eyes, it is easier for the human eyes to observe green light from the three red, blue, and green light. Based on this, two sub-pixels in each first pixel 100 adjacent to the corresponding sub-pixel of the same color in one of adjacent second pixels 200 include a red sub-pixel and a blue sub-pixel. That is, in some embodiments of the present disclosure, a single sub-pixel in adjacent pixels may be set as a green sub-pixel, that is, two adjacent sub-pixels are not set as two green sub-pixels.

The pixel structure is shown in FIG. 1. The plurality of first pixels 100 and the plurality of second pixels 200 are alternately arranged in sequence along a row direction X. The first sub-pixel 10 and the third sub-pixel 30 in each first pixel 100 are disposed adjacent to a corresponding sub-pixel in one of adjacent second pixels 200, and the second sub-pixels 20 in each first pixel 100 and each second pixel 200 are arranged separately. Based on this, the second sub-pixel 20 is set as a green sub-pixel, which is distributed separately, and its adjacent sub-pixels are not green sub-pixels. The first sub-pixel 10 is set as the red sub-pixel, and the third sub-pixel 30 is set as the blue sub-pixel; or, the first sub-pixel 10 is set as the blue sub-pixel, and the third sub-pixel 30 is set as the red sub-pixel. Each of the first sub-pixel 10 and the third sub-pixel 30 is disposed adjacent to a same colored sub-pixel.

The embodiment of the present disclosure adopts a pixel structure in which the green sub-pixel is distributed separately, which can control the emission range of the light of the corresponding color of different sub-pixels, thereby balancing the sensitivity of the human eyes to light of different colors, so as to improve user's experience when viewing the display screen.

Based on this, some embodiments of the present disclosure may select the distribution setting of each pixel in the row direction and the column direction as required, and embodiments of the present disclosure do not limit this. In addition, some embodiments of the present disclosure also do not limit the opening shape of each sub-pixel in the pixel structure. For example, the opening shape of each sub-pixel is a quadrangle (including a rectangle as shown in FIG. 1 to FIG. 3), a pentagon (as shown in FIG. 4), hexagons, or other shapes, which are not repeated herein.

Figure 4:
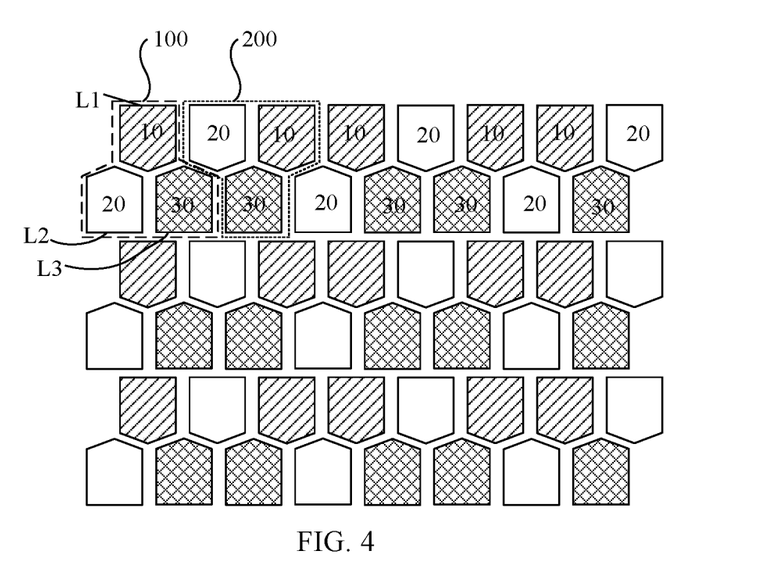
FIG. 4 is a schematic structural diagram of still another pixel structure according to some embodiments of the present disclosure.

As shown in FIG. 4, the opening shape of each sub-pixel is an axis-symmetric pentagon, and the five corners of the pentagon include a set of adjacent right angles.

In some embodiments, referring to FIG. 4, the side in the pentagon that lies between two adjacent right angles is the first right-angled side (such as L1, L2, and L3 shown in FIG. 4). Among the three sub-pixels of each pixel, first right-angle sides (such as L2 and L3) of two sub-pixels positioned in the same row (for example, the second sub-pixel 20 and the third sub-pixel 30 in the first pixel 100) are flush with each other, and the first right-angle sides of the two sub-pixels are parallel with a first right-angle side (such as L1) of another sub-pixel (such as the first sub-pixel 10 in the first pixel 100) in an adjacent row, and the three sub-pixels of each pixel are positioned between a line where the first right-angle sides of the two sub-pixels are positioned and a line where the first right-angle side of another sub-pixel is positioned.

The embodiment of the present disclosure adopts the pixel structure described above, so that each sub-pixel in the plurality of pixels can be arranged neatly, and the degree of corporation of sub-pixels between adjacent pixels can be enhanced, thereby helping to improve the uniformity of the distribution of pixels. The color of the pictures displayed by each pixel is ensured to be more uniform, thereby enhancing the user's experience when viewing the displayed picture.

Some embodiments of the present disclosure also provide a display panel including the pixel structure of any of the above embodiments. The display panel has the same structure and beneficial effects as the pixel structure provided by the foregoing embodiments. Since the structure and beneficial effects of the pixel structure have been described in detail in some of the foregoing embodiments, details are not described herein.

It should be noted that, in some embodiments of the present disclosure, the display panel includes at least a liquid crystal display panel and an organic light emitting diode display panel. The display panel can be applied to products or components having a display function, such as a liquid crystal display, an LCD television, a digital photo frame, a mobile phone, or a tablet.

Figure 7:
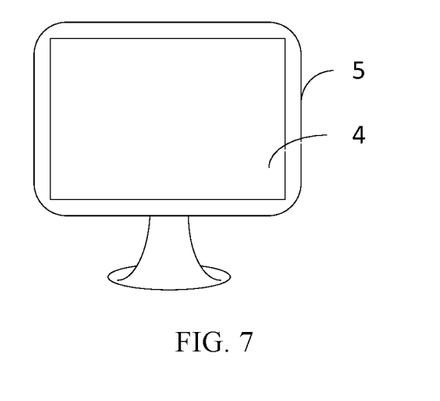
FIG. 7 is a schematic structural diagram of a display device according to some embodiments of the present disclosure.

Some embodiments of the present disclosure also provide a display device. Referring to FIG. 7, the display device 5 includes the display panel 4 of any one of the above embodiments. This display device has the same beneficial effects as the above-mentioned display panel, which will not be repeated herein.

According to embodiments, the display device includes products or components having a display function, such as a liquid crystal panel, an electronic paper, an OLED panel, a mobile phone, a tablet computer, a television, a display, a notebook computer, a digital photo frame, and a navigator.

Some embodiments of the present disclosure further provide a mask plate group configured to manufacture the pixel structure described above. The mask plate group includes three mask plates provided in one-to-one correspondence with sub-pixel colors. Each of the three mask plates is provided with a plurality of openings, wherein any one of the openings of at least two mask plates corresponds to two adjacent sub pixels of the same color in the pixel structure.

In some embodiments, according to sub-pixels of different colors in each pixel, the corresponding three mask plates are respectively defined as: a first mask plate, a second mask plate, and a third mask plate, and the openings on the different mask plates correspond to the areas for forming the correspondingly colored sub-pixel in the pixel structure, respectively. For example, the opening on the first mask plate corresponds to the area for forming the first sub-pixels in the pixel structure, the opening on the second mask plate corresponds to the area for forming the second sub-pixels in the pixel structure, and the opening on the third mask plate corresponds to the area for forming the third sub-pixels in the pixel structure.

It can be understood that, in the case where two first sub-pixels are disposed adjacent to each other, each opening in the first mask plate corresponds to the area for forming the two first sub-pixels. That is, the size (including the area and/or the perimeter) of the opening configured to manufacture the two adjacent first sub-pixels of the same color is substantially the same as the overall size (outer outline) of the area for forming the two first sub-pixels. Similarly, in the case where two second sub-pixels are disposed adjacent to each other, each opening in the second mask plate corresponds to the area for forming the two second sub-pixels. Alternatively, in the case where two third sub-pixels are disposed adjacent to each other, each opening in the third mask plate corresponds to the area for forming the two three sub-pixels. Therefore, in the case where any opening of the mask plate corresponds to two adjacent sub pixels of the same color in the pixel structure, the area of each opening in the mask plate is large, which not only reduces the difficulty in manufacturing the mask plate, but also reduces the difficulty in alignment during the mask process, so as to reduce the probability of color mixing and improve the uniformity of the arrangement of sub-pixels.

Of course, it should be understood that, in an actual mask process, a mask assembly (also referred to as mask frame assembly, MFA) including a mask plate is usually used for the mask process. The mask process has been explained previously, and is not repeated here.

Figure 5A:
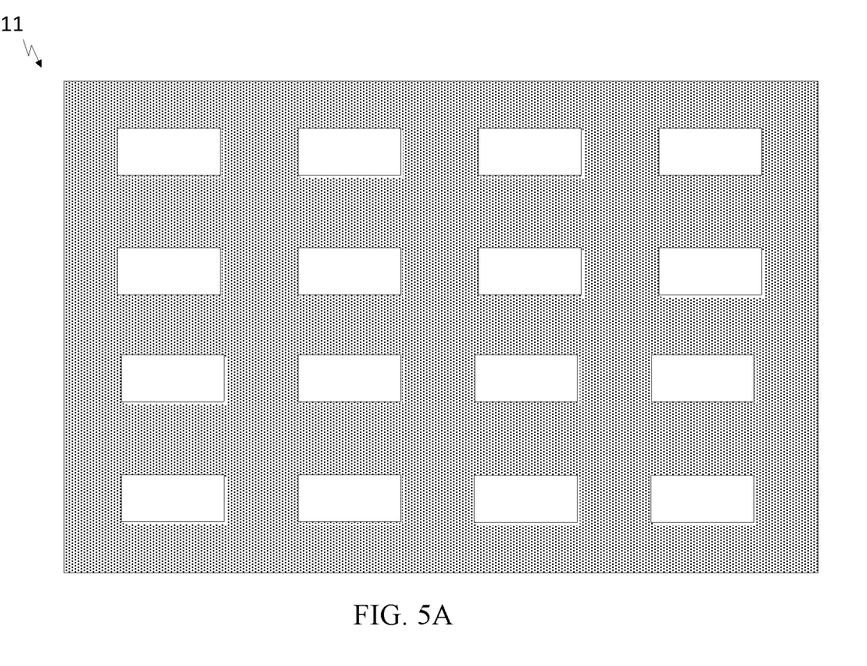
FIG. 5A to FIG. 5C are structural schematic diagrams of three mask plates in a mask plate group corresponding to the pixel structure shown in FIG. 1.
Figure 5B:
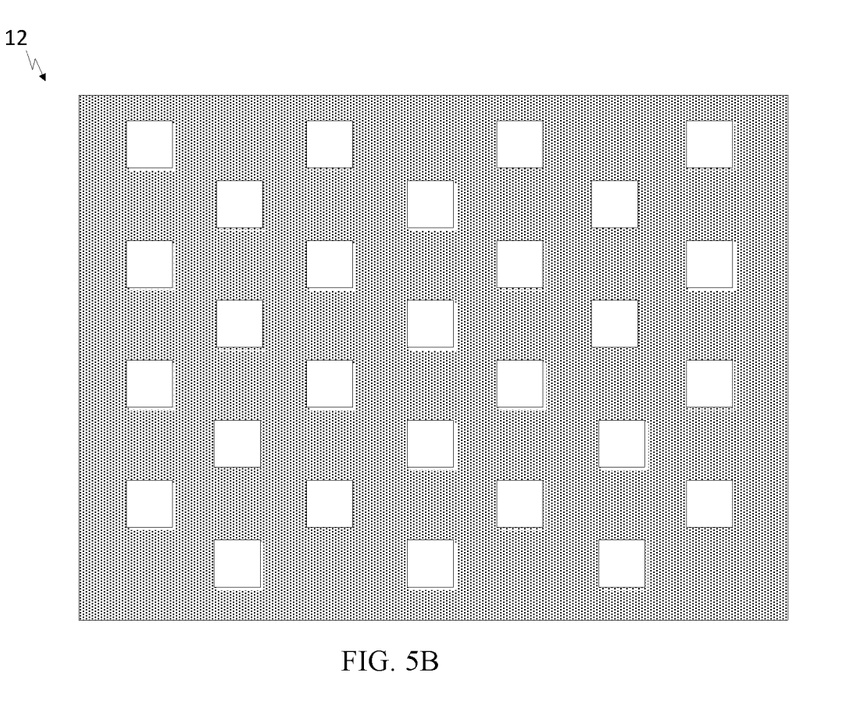
Figure 5C:
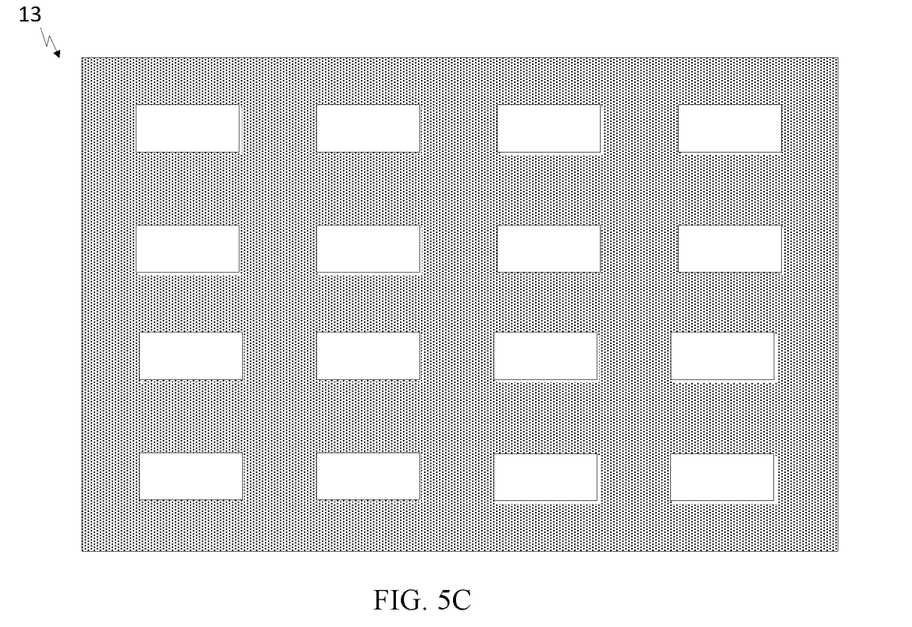

The pixel structure adopts the distribution mode shown in FIG. 1, and the three mask plates in the mask plate group required for manufacturing the pixel structure are shown in FIGS. 5A to 5C, respectively. Any opening of the two mask plates corresponds to two adjacent sub-pixels of the same color in the pixel structure, and the plurality of openings of another mask correspond to the plurality of sub-pixels of corresponding colors in the pixel structure in a one-to-one manner. The first mask plate 11 in the mask plate group is configured to manufacture first sub-pixels 10, and its structure is shown in FIG. 5A. Each opening of the first mask plate 11 corresponds to the area for forming corresponding two first sub-pixels 10. That is, the size of each opening of the first mask plate 11 is slightly larger than or equal to the size of the area for forming the corresponding two first sub-pixels 10. That is, the orthographic projection of each opening of the first mask plate 11 on the reference plane and the orthographic projections of the area for forming the corresponding two first sub-pixels 10 on the same reference plane overlap or substantially overlap. The second mask plate 12 in the mask plate group is configured to manufacture second sub-pixels 20, and its structure is shown in FIG. 5B. Each opening of the second mask plate 12 corresponds to the area for forming a corresponding second sub-pixel 20 in a one-to-one manner. That is, the size of each opening of the second mask plate 12 is slightly larger than or equal to the size of the area for forming one second sub-pixels 20. That is, the orthographic projection of each opening of the second mask plate 12 on the reference plane and the orthographic projections of the area for forming one second sub-pixels 20 on the same reference plane overlap or substantially overlap. The third mask plate 13 in the mask plate group is configured to manufacture third sub-pixels 30, and its structure is shown in FIG. 5C. Each opening of the third mask plate 13 corresponds to the area for forming the corresponding two third sub-pixels 30.

Figure 6A:
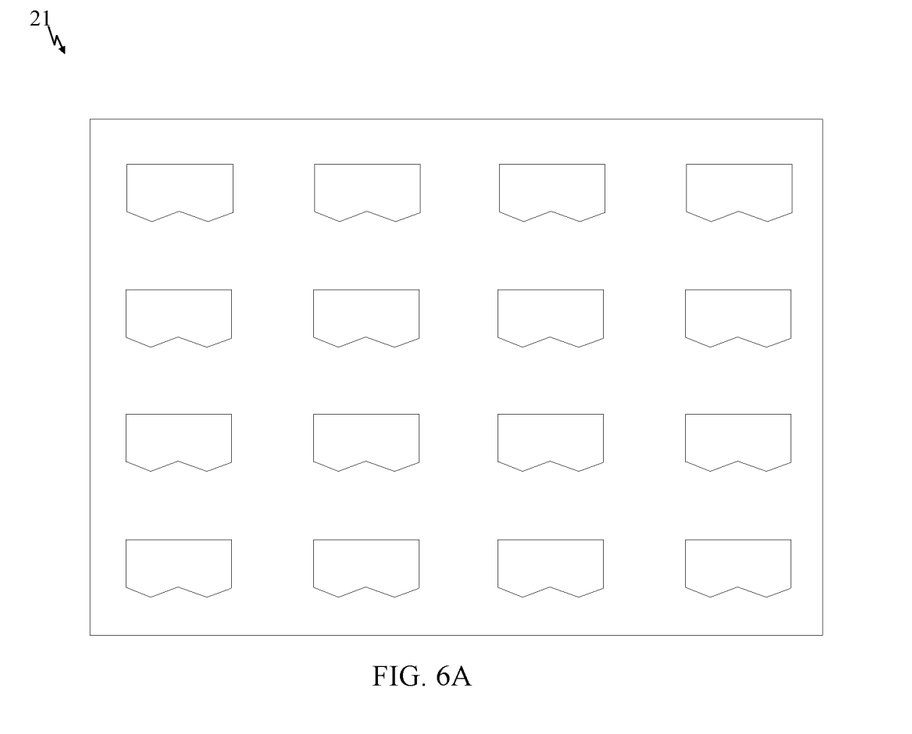
FIG. 6A to FIG. 6C are schematic structural diagrams of three mask plates in a mask plate group corresponding to the pixel structure shown in FIG. 4.
Figure 6B:
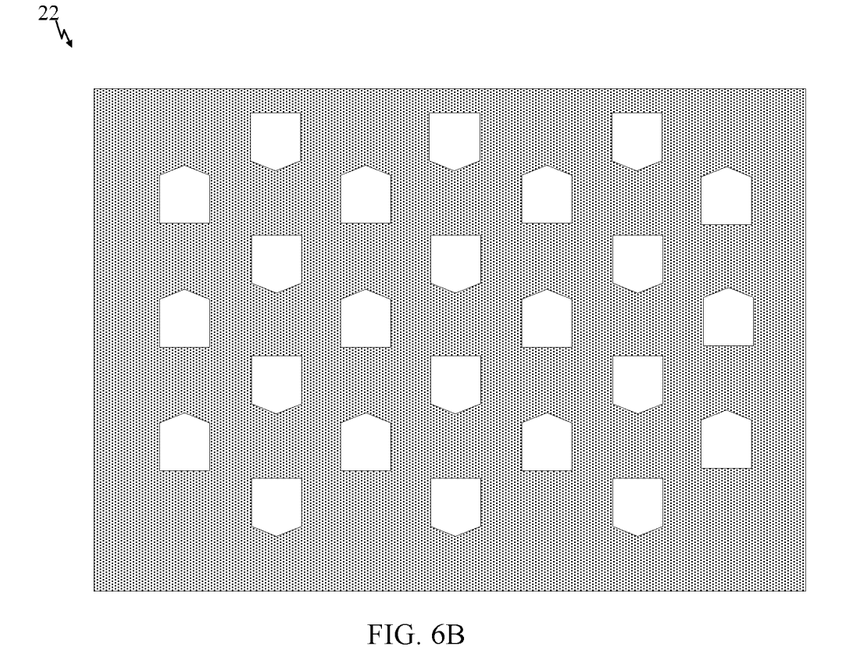
Figure 6C:
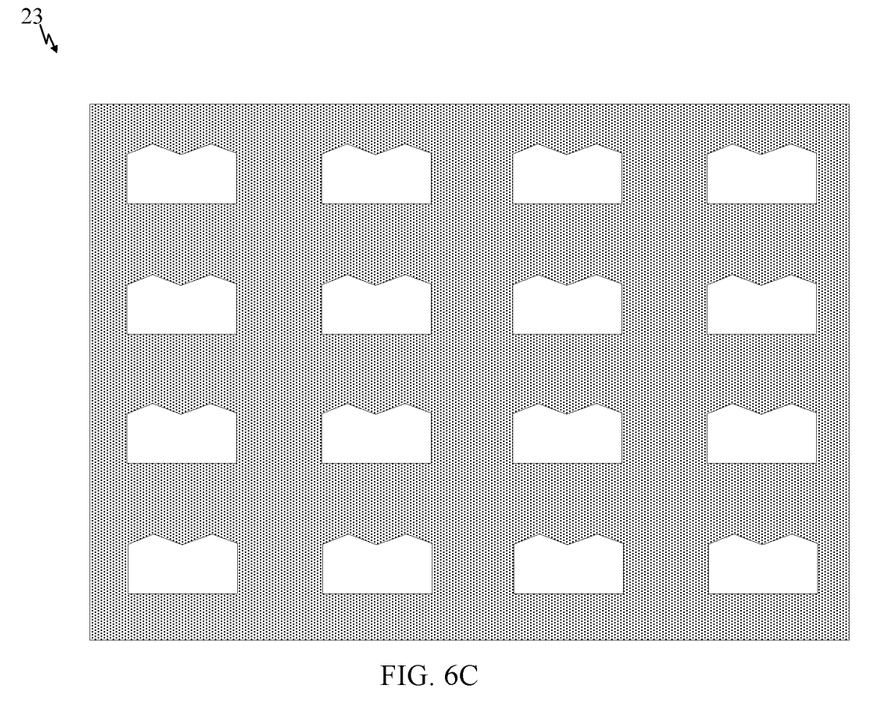

As another example, the pixel structure adopts the distribution mode shown in FIG. 4, and the three mask plates in the mask plate group required for manufacturing the pixel structure are shown in FIGS. 6A to 6C, respectively. Any opening of the two mask plates corresponds to two adjacent sub-pixels of the same color in the pixel structure, and the plurality of openings of another mask correspond to the plurality of sub-pixels of corresponding colors in the pixel structure in a one-to-one manner. The first mask plate 21 in the mask plate group is configured to manufacture first sub-pixels 10, and its structure is shown in FIG. 6A. Each opening of the first mask plate 21 corresponds to the area for forming the corresponding two first sub-pixels 10. That is, the size of each opening of the first mask plate 21 is slightly larger than or equal to the size of the area for forming the corresponding two first sub-pixels 10. That is, the orthographic projection of each opening of the first mask plate 21 on the reference plane and the orthographic projections of the area for forming the corresponding two first sub-pixels 10 on the same reference plane overlap or substantially overlap. The second mask plate 22 in the mask plate group is configured to manufacture second sub-pixels 20, and its structure is shown in FIG. 6B. Each opening of the second mask plate 22 corresponds to the area for forming one two second sub-pixel 20 in a one-to-one manner. That is, the size of each opening of the second mask plate 22 is slightly larger than or equal to the size of the area for forming one second sub-pixels 20. That is, the orthographic projection of each opening of the second mask plate 22 on the reference plane and the orthographic projections of the area for forming one second sub-pixel 20 on the same reference plane overlap or substantially overlap. The third mask plate 23 in the mask plate group is configured to manufacture third sub-pixels 30, and its structure is shown in FIG. 6C. Each opening of the third mask plate 23 corresponds to the area for forming the corresponding two third sub-pixels 30.

It can be seen that each opening in the mask plates is disposed to correspond to the area for forming the corresponding sub-pixel(s). In this way, for the pixel structure using other distribution methods, referring to the above-mentioned setting conditions of each mask plate in FIG. 5A to FIG. 5C or FIG. 6A to FIG. 6C, the shape and setting position of each opening in the mask plate can be reasonably designed, so as to make the shape and setting position of each opening correspond to the area for forming the corresponding sub-pixel(s), and repeated descriptions will not be provided here.

In the description of the foregoing embodiments, specific features, structures, materials, or characteristics may be combined in an appropriate manner in any one or more embodiments or examples.

The above are only specific implementations of the present disclosure, but the protection scope of the present disclosure is not limited to this. A person skilled in the art can understandably think of changes or replacements within the technical scope disclosed in the present disclosure, which fall within the scope of the present disclosure. Therefore, the protection scope of the present disclosure shall be defined by the appended claims.

What is claimed is:

1. A pixel structure, comprising:
   a plurality of pixels arranged in an array, each pixel comprising three sub-pixels of different colors arranged in two adjacent rows, wherein:
   the plurality of pixels further comprise a plurality of first pixels and a plurality of second pixels, the plurality of first pixels and the plurality of second pixels being alternately arranged in sequence along a row direction;
   along the row direction, one sub-pixel in each first pixel is positioned in a same row as two sub-pixels in adjacent second pixels, and other two sub-pixels in the each first pixel are positioned in a same row as another one sub-pixel in the adjacent second sub-pixels; and
   two sub-pixels positioned in different rows in the each first pixel are disposed adjacent to corresponding same colored sub-pixels in two second pixels which are adjacent to the first pixel and are in the same row as the first pixel.

2. The pixel structure according to claim 1, wherein, among the three sub-pixels in each pixel, a central line of a gap between two sub-pixels in a same row along the row direction is aligned with a central line of another sub-pixel in an adjacent row along the row direction.

3. The pixel structure according to claim 1, wherein the two sub-pixels in the each first pixel disposed adjacent to corresponding same colored sub-pixels in the adjacent second pixels comprise one red sub-pixel and one blue sub-pixel.

4. The pixel structure according to claim 1, wherein the plurality of pixels positioned in a same column comprise a plurality of first pixels or a plurality of second pixels.

5. The pixel structure according to claim 1, wherein an opening shape of each of the sub-pixels comprises a quadrangle, a pentagon, or a hexagon.

6. The pixel structure according to claim 1, wherein an opening shape of each of the sub-pixels comprises a pentagon arranged axisymmetrically, and five corners of the pentagon comprise a pair of right-angles arranged adjacently.

7. The pixel structure according to claim 6, wherein:
among the three sub-pixels of each pixel, first right-angle sides of two sub-pixels positioned in a same row are flush with each other, and the first right-angle sides of the two sub-pixels are parallel with a first right-angle side of another sub-pixel in an adjacent row;
the three sub-pixels are positioned between a line where the first right-angle sides of the two sub-pixels are positioned and a line where the first right-angle side of the another sub-pixel is positioned; and
the first right-angled side is a side positioned between two adjacent right angles in the pentagon.

8. The pixel structure according to claim 1, wherein three sub-pixels in each first pixel constitute vertices of a triangle, and three sub-pixels in each second pixel constitute vertices of an inverted triangle.

9. A display panel, comprising:
a pixel structure, wherein the pixel structure comprises a plurality of pixels arranged in an array, each pixel comprising three sub-pixels of different colors arranged in two adjacent rows, wherein:
the plurality of pixels further comprise a plurality of first pixels and a plurality of second pixels, the plurality of first pixels and the plurality of second pixels are alternately arranged in sequence along a row direction;
along the row direction, one sub-pixel in each first pixel is positioned in a same row as two sub-pixels in adjacent second pixels, and other two sub-pixels in the each first pixel are positioned in a same row as another one sub-pixel in the adjacent second sub-pixels; and
two sub-pixels positioned in different rows in the each first pixel are disposed adjacent to corresponding same colored sub-pixels in two second pixels which are adjacent to the each first pixel and are in the same row as the each first pixel.

10. The display panel according to claim 9, wherein, among the three sub-pixels in each pixel, a central line of a gap between two sub-pixels in a same row along the row direction is aligned with a central line of another sub-pixel in an adjacent row along the row direction.

11. The display panel according to claim 9, wherein the two sub-pixels in the each first pixel disposed adjacent to corresponding same colored sub-pixels in the adjacent second pixels comprise one red sub-pixel and one blue sub-pixel.

12. The display panel according to claim 9, wherein the plurality of pixels positioned in a same column comprise a plurality of first pixels or a plurality of second pixels.

13. The display panel according to claim 9, wherein an opening shape of each of the sub-pixels comprises a quadrangle, a pentagon, or a hexagon.

14. The display panel according to claim 9, wherein an opening shape of each of the sub-pixels comprises a pentagon arranged axisymmetrically, and five corners of the pentagon comprise a pair of right-angles arranged adjacently.

15. The display panel according to claim 14, wherein:
among the three sub-pixels of each pixel, first right-angle sides of two sub-pixels positioned in a same row are flush with each other, and the first right-angle sides of the two sub-pixels are parallel with a first right-angle side of another sub-pixel in an adjacent row;
the three sub-pixels are positioned between a line where the first right-angle sides of the two sub-pixels are positioned and a line where the first right-angle side of the another sub-pixel is positioned; and
the first right-angled side is a side positioned between two adjacent right angles in the pentagon.

16. The pixel structure according to claim 9, wherein three sub-pixels in each first pixel constitute vertices of a triangle, and three sub-pixels in each second pixel constitute vertices of an inverted triangle.

17. A mask plate group configured to manufacture a pixel structure, wherein the pixel structure comprises:
a plurality of pixels arranged in an array, each pixel comprising three sub-pixels of different colors arranged in two adjacent rows, wherein:
the plurality of pixels further comprise a plurality of first pixels and a plurality of second pixels, the plurality of first pixels and the plurality of second pixels are alternately arranged in sequence along a row direction;
along the row direction, one sub-pixel in each first pixel is positioned in a same row as two sub-pixels in adjacent second pixels, and other two sub-pixels in the each first pixel are positioned in a same row as another one sub-pixel in the adjacent second sub-pixels; and
two sub-pixels positioned in different rows in the each first pixel are disposed adjacent to corresponding same colored sub-pixels in two second pixels which are adjacent to the first pixel and are in the same row as the first pixel;
wherein the mask plate group comprises three mask plates provided in one-to-one correspondence with sub-pixel colors; and
wherein each of the three mask plates is provided with a plurality of openings, any one of the openings of at least two mask plates corresponding to two adjacent sub pixels of a same color in the pixel structure.

* * * * *